United States Patent
Unuchek et al.

(10) Patent No.: US 12,364,144 B2
(45) Date of Patent: Jul. 15, 2025

(54) MULTILAYER ELECTRONIC DEVICE AND METHOD FOR PRODUCING THE SAME

(71) Applicant: FRESHAPE SA, Villaz-St-Pierre (CH)

(72) Inventors: Dmitrii Unuchek, Ecublens (CH); Tonglai Chen, Orbe (CH); Yuhang Liu, Bussigny (CH); Vanni Cedric Simone Roldi, Villaz-St-Pierre (CH)

(73) Assignee: FRESHAPE SA, Villaz-St-Pierre (CH)

( * ) Notice: Subject to any disclaimer, the term of this patent is extended or adjusted under 35 U.S.C. 154(b) by 0 days.

(21) Appl. No.: 17/926,750

(22) PCT Filed: Jun. 21, 2021

(86) PCT No.: PCT/EP2021/066758
§ 371 (c)(1),
(2) Date: Nov. 21, 2022

(87) PCT Pub. No.: WO2021/259827
PCT Pub. Date: Dec. 30, 2021

(65) Prior Publication Data
US 2023/0207715 A1 Jun. 29, 2023

(30) Foreign Application Priority Data
Jun. 23, 2020 (EP) .................................. 20181798

(51) Int. Cl.
*H10K 59/86* (2023.01)
*H10F 19/90* (2025.01)
(Continued)

(52) U.S. Cl.
CPC .......... *H10K 59/86* (2023.02); *H10F 19/904* (2025.01); *H10F 71/00* (2025.01); *H10K 39/12* (2023.02)

(58) Field of Classification Search
CPC ... H01L 31/0224; H01L 31/04; H01L 31/046; H01L 31/0463; H01L 31/0465;
(Continued)

(56) References Cited

U.S. PATENT DOCUMENTS

| | | |
|---|---|---|
| 2005/0093001 A1 | 5/2005 | Liu et al. |
| 2009/0151776 A1 | 6/2009 | Schindler |

(Continued)

FOREIGN PATENT DOCUMENTS

| | | | |
|---|---|---|---|
| EP | 1970960 A2 | 9/2008 | |
| WO | WO-2012102218 A1 * | 8/2012 | ......... H01L 27/3204 |

OTHER PUBLICATIONS

Machine translation of WO-2012102218-A1, Aratani Sukekazu. (Year: 2012).*

*Primary Examiner* — Mayla Gonzalez Ramos
(74) *Attorney, Agent, or Firm* — Robert C. Netter, Jr.; Dann, Dorfman, Herrell & Skillman

(57) ABSTRACT

The present invention concerns an electronic device, preferably a thin film electronic device, and a method for producing the device. The device comprises an intermediate structure (301, 401, 501) at the interface between neighboring unit devices connected in series. The intermediate structure is suitable to employ deposition techniques that make it possible to avoid steps of scribing or patterning insulating and/or separating lines between adjacent layers of the device.

22 Claims, 4 Drawing Sheets

(51) Int. Cl.
*H10F 71/00* (2025.01)
*H10K 39/12* (2023.01)

(58) Field of Classification Search
CPC . H01L 31/05; H01L 31/0504; H01L 31/0508; H01L 31/0512; H01L 31/18; H01L 31/186; H10K 59/86; H10K 39/12; H10F 19/90; H10F 71/00
See application file for complete search history.

(56) References Cited

U.S. PATENT DOCUMENTS

| | | | |
|---|---|---|---|
| 2010/0277403 A1 | 11/2010 | Chao et al. | |
| 2011/0148288 A1* | 6/2011 | Chen | H10K 59/86 445/35 |
| 2016/0276413 A1 | 9/2016 | Iida et al. | |
| 2019/0378945 A1* | 12/2019 | Allais | H01L 31/072 |

\* cited by examiner

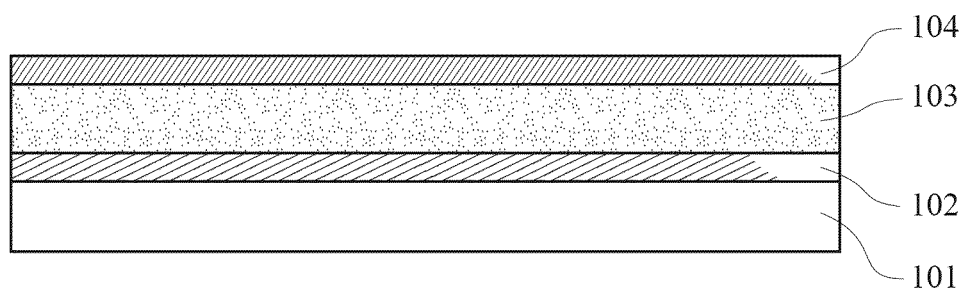
Figure 1 (Prior Art)
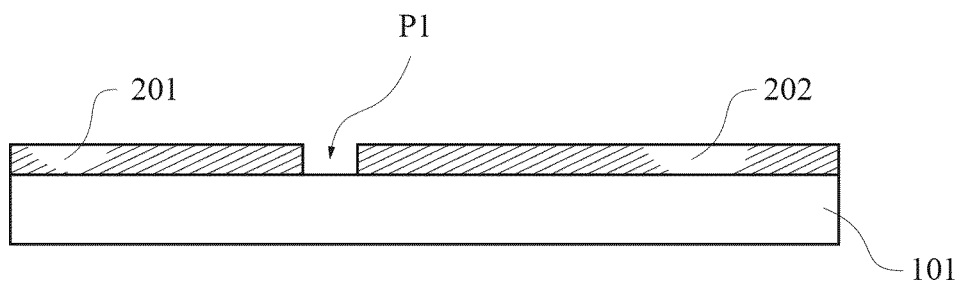
Figure 2 (a) (Prior Art)
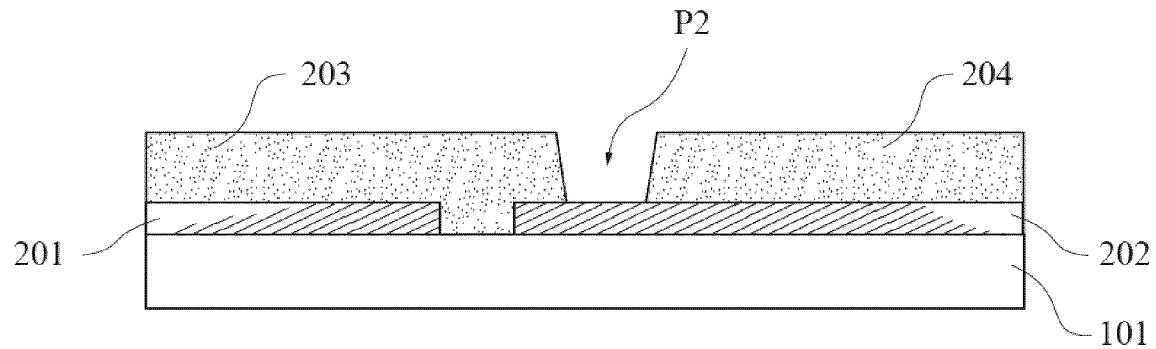
Figure 2 (b) (Prior Art)
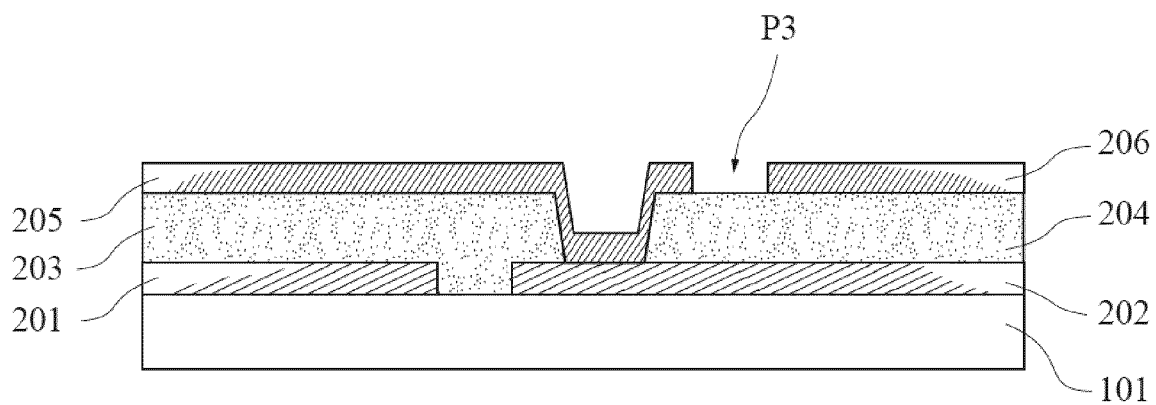
Figure 2 (c) (Prior Art)

MULTILAYER ELECTRONIC DEVICE AND METHOD FOR PRODUCING THE SAME

The present application is § 371 application of PCT/EP2021/066758, filed Jun. 21, 2021, which claims priority to EP Application Serial No. 20181798.8, filed Jun. 23, 2020. The entire disclosure of each of the foregoing applications is incorporated by reference herein.

TECHNICAL FIELD

The present invention relates to a multilayer electronic device comprising a plurality of unit electronic devices, such as thin-film devices, and to methods for producing such devices.

BACKGROUND ART AND PROBLEMS SOLVED BY THE INVENTION

Multilayer electronic devices, in particular thin-film devices are an essential part of electronics and are integrated in many functional devices.

For example, thin-film photovoltaics represent an emerging technology for production of solar cells with a semiconducting layer that converts light into electricity having a thickness below tens of micrometers. These types of cells include but are not limited to the following technologies: organic solar cells, dye-synthesized solar cells, perovskite solar cells, and copper indium gallium selenide solar cells, for example.

Usage of thin-film technology has several benefits. For instance, this technology allows to decrease consumption of the semiconducting material, reducing the manufacturing cost of the resulting solar cell. Also, thin-film technology may be used for the production of flexible and/or semi-transparent photovoltaic modules.

The basic structure of thin-film solar cells, as shown in FIG. 1, comprises a rigid or flexible substrate 101 with a conductive layer 102 on it that plays the role of the electrode for collection of photogenerated charges. For the further reference, this layer is set to be called the bottom or lower electrode. On top of the bottom electrode 102 there is a photovoltaic layer 103 that is absorbing light and converting it into electrical charges. This layer may comprise several films depending on the type and architecture of the solar cell. Films composing the photovoltaic layer might include one or more n-type semiconductor, p-type semiconductor, buffer layer, electron blocking layer, hole blocking layer, active organic layer, or others. On the top of the photovoltaic layer there is another layer of conductive material that is used as a second electrode. For the further references this layer is set to be called the top or upper electrode 104. At least one of the electrode layers is designed to be transparent or semi-transparent in order to allow light transmission through it and following absorption by the photovoltaic layer. While the described above structure is exemplary, alternative structures can also be used for thin-film solar cell production.

In case of a transparent or semi-transparent solar cell, such materials as glass or transparent polymers can be used as substrate 101. One or both conducting layers 102 and 104 are preferably also of high transparency. The latter can be achieved by employing a big variety of materials and combination of these materials like indium-tin-oxide (ITO), thin metal layers, various oxide materials or other materials and their combinations.

In order to improve the efficiency of a solar panel (also referred as solar module or photovoltaic module), the plurality of individual solar cells are usually intended to be connected in series via interconnects within the solar module. A set of electrical connections between the top and bottom electrode of the neighboring cells is an example of such interconnect structures.

A general fabrication procedure of a thin-film solar module will be explained below with reference to FIGS. 2(a)-(c). This figure schematically represents the formation of two solar cells connected in series, in the following referred to as the left (or first) cell and the right (or second) cell or unit device. However, this technique is not limited to one pair of neighboring solar cells but can be applied to the fabrication of multiple solar cells connected in series via interconnects. The fabrication of such interconnects is a complicated process that includes scribing of the set of well-aligned lines or tranches referred to as P1, P2, P3. Such patterning is usually performed by laser scribing techniques. As in FIG. 2(a), P1 line is a gap that disconnects parts of the bottom electrode layer 102 into independent bottom electrodes 201 and 202 of the left and right cells, respectively. During the deposition of the photovoltaic layer, this P1 scribed line is filled with a photovoltaic layer. As shown in FIG. 2(b), scribing line P2 provides a gap in the photovoltaic layer 103 to separate it into the disconnected photovoltaic layers of 203 and 204 of the left and right cells, respectively. During the deposition of the top conducting layer 104 the P2 scribed line is filled with a conducting layer, establishing an electrical connection between the top and bottom electrode. As shown in FIG. 2(c), P3 scribing line extends through the top electrode 104, dividing this layer into electrically separated top electrodes 205 and 206 of the left and right cells, respectively. While the main purpose of the P3 scribing line is to disconnect top electrodes of the neighbouring solar cells, the P3 line may also penetrate the photovoltaic layer. As the result of P1, P2, P3 scribing lines, the top electrode of the left cell 205 becomes electrically connected to the bottom layer of the right cell 202, resulting in serial connection of neighboring solar cells and ensuring ability of current circulation in the solar module.

However, the formation of the P1, P2, P3 scribing lines generally requires an expensive laser or set of lasers for film scribing, and complex systems for positioning of modules with respect to the laser beam for each scribing line. As a result, fabrication of such interconnected structures causes an increase of solar module fabrication time and/or complexity. In turn, this causes an increase of the production cost. Furthermore, laser scribing might lead to the appearance of low resistance points or shunts between the top and bottom electrode layers within the solar cell, resulting in a reduction of the overall efficiency of the photovoltaic module. This is particularly problematic for the P3 scribing line, since the P3 scribing process causes redeposition of the conducting material and photovoltaic materials. If not well optimized, the P3 scribing process may also damage the bottom electrode 202. Therefore, there is an urgent need for an alternative approach which allows simple, fast and reliable module interconnects fabrication, free of P3 scribing process. Ideally, such an alternative fabrication approach should be a laser-scribing-free process. At least, the laser scribing of the electronic layer 103 and/or of the to electrode layer 104 should be ideally avoided or rendered less damaging.

It is an objective of the invention to overcome above-mentioned limitations of the existing laser scribing technologies for interconnection of thin-film devices within module comprising a plurality of such devices, generally connected in series.

U.S. Pat. No. 7,927,497B2 discloses a process comprising depositing layers of a solar cell, etching the layers at a particular localisation, and obliquely depositing at least one conductive material so as to connect the unit solar cells in series. It is an objective of the present invention to avoid a particular etching step, which may need to be conducted in a very precise manner.

US2016329446A1 proposes the patterning of substrate materials and a particular apparatus for manufacturing thin film devices, wherein layers can be deposited obliquely in the apparatus. It is an objective of the present invention to avoid patterning of the substrate.

WO 2012/102218 discloses a method for manufacturing an organic light emitting device (OLED) comprising the deposition of an asymmetric bank comprising several layer portions deposited in separate steps, and a light-emitting layer is deposited without oblique deposition. The asymmetric bank is used in subsequent deposition steps to avoid short circuit between the upper and lower electrodes of a single device.

EP 1970960A2 also discloses a method for producing an OLED, comprising the deposition of stripes of a conductor part on a first electrode and a partition separator on an insulating layer. In view of this and further documents, it is an objective of the invention to provide a simple process for producing a multilayer electronic device, the process reducing the number of separate deposition steps compared to the prior art.

US 2010/0277403 discloses a method of making an organic electroluminescent device with pixel structure, comprising the locally restricted deposition of a second passivation layer on an anode layer, followed by the deposition of partitions and the deposition of luminescent and cathode layers.

US 2016/0276413 discloses several methods for producing a solar cell, such as an embodiment comprising a structured substrate formed from a resin while using a quartz mold, and the deposition of conducting Cu-partition walls, wherein insulating layers on the latter are made by heating the conducting Cu-partitions in an oxygen atmosphere.

US 2005/0093001 discloses a method for making an OLED where three different components are produced separately and laminated together at the end while using an adhesive layer that extends from the third component through holes in the second component so as to reach and bond the first component.

It is also an objective of the invention to solve the problems mentioned herein while using flat, non-structured substrates for depositing the unit devices, or while avoiding a particular step of structuring the surface of the substrate. Such structuring may also require precise tools and may also impose limitations with respect to the choice of the substrate material. For example, it is an objective of the invention to use transparent conductive substrates which are commercially available, such as transparent conductive glass or plastic.

The present invention addresses the problems depicted above. It is an objective of the invention to provide alternative manners for producing thin fil devices, such as thin-film solar cells, thin-film transistors, thin-film LEDs, and thin-film OLEDs.

SUMMARY OF THE INVENTION

In order to overcome the above-mentioned limitations and technical problems, the present inventors disclose here a particular type of structures which are employed for simplified manufacturing of multilayer electronic devices, in particular thin-film devices. The invention also concerns methods for manufacturing such devices using such structures.

In an aspect, the invention employs a particular type of structures called here intermediate or meso- or interconnect structures, which preferably stand above the substrate and assist self-patterning of the particular layers of the multilayer device, exploiting shadow effect during the directional deposition and/or physical separation of the solution casting of those particular layers. Such self-patterning of the deposited layer is surprisingly self-aligned along the structure and therefore does generally not require specific alignment tools.

In some embodiments the said structures are insulating and cause self-patterning of at least one electrode layer of the multilayer devices. While in other embodiments the said structures are conducting and thus preferably play a role of conducting interconnects between neighboring unit devices within a module, in addition to the self-patterning of the top electrode layer.

In other embodiments, the said structures, employed together with controlling the direction of deposition, allows scribing-free fabrication of the interconnects between the plurality of the unit devices within the module, by exploiting shadow effects during the deposition of one or both electrode or conductive layers.

Therefore, in certain embodiments, the use of precise alignment apparatus is reduced or even no positioning control is required, thus reducing manufacturing costs. Furthermore, due to self-aligned patterning, a non-effective area that is determined by the separation between unit devices can be greatly reduced by using the structures, resulting in an enhancement in the solar module efficiency.

In an aspect, the invention provides a multilayer electronic device comprising a plurality of unit electronic devices, said unit devices being connected in series, wherein said plurality of unit electronic devices comprise at least a first unit device and a second unit device, the multilayer electronic device comprising:
  a substrate or non-conducting base layer,
  two opposed conducting layers comprising a lower conductive layer and an upper conductive layer,
  at least one electronic layer comprising a material having one or more selected from the group consisting of semiconducting, photovoltaic, photoelectric and/or electroluminescent properties, said electronic layer being provided between said upper and lower conductive layers,
  an intermediate structure comprising a conductive, semiconducting or an insulating material, the intermediate structure being preferably provided between two neighbouring unit electronic devices, wherein said intermediate structure is in direct contact with at least one of said two opposed conductive layers, and wherein said intermediate structure physically separates at least part of the electronic layers of neighbouring unit devices.

In an aspect, the invention provides a method for producing a multilayer electronic device, the method comprising:
  providing a substrate comprising a first conducting layer and, optionally, patterning said first conducting layer so as to obtain a plurality of electrically separated conducting layers;
  depositing an intermediate structure on said substrate or, if said first conducting layer has been previously deposited, at least partially on said lower conducting layer;

depositing at least one electronic layer comprising a material having semiconducting, photovoltaic, photoelectric and/or electroluminescent properties;

depositing an upper conducting layer on top of said electronic layer.

In an aspect, the invention provides a method for producing a multilayer electronic device, the method comprising:

providing a substrate and/or a non-conducting base layer;

depositing a lower conducting layer and, optionally, patterning said lower conducting layer so as to obtain a plurality of electrically separated conducting layers;

depositing an intermediate structure on said substrate or, if said lower conducting layer has been previously deposited, at least partially on said lower conducting layer;

depositing at least one electronic layer comprising a material having semiconducting, photovoltaic, photoelectric and/or electroluminescent properties;

depositing an upper conducting layer on top of said electronic layer, wherein, during depositing said upper conducting layer, said intermediate structure provides a shaded area and/or separation structure such that, during depositing said upper conducting layer, a plurality of separated upper conducting layers is obtained, said separated upper conducting layers being electrically separated by said shaded area and/or separation structure.

In some aspects, the invention provides a device obtained by the method of the invention, and the method for obtaining the device of the invention.

In an embodiment, said intermediate structure is formed by a single and/or continuous and preferably homogenous material, which is preferably provided in a single deposition step, and which preferably has continuous electronic properties. Preferably, the intermediate structure deposited simultaneously, in one deposition event, not in timely successive deposition events.

In an embodiment, the device comprises only one intermediate structure per unit device, said only one intermediate structure longitudinally extending between neighbouring unit devices and/or providing a projection on said surface of said substrate or on said lower conductive layer.

In an embodiment, the intermediate structure is provided on said substrate or is in contact with the substrate.

In an embodiment, the intermediate structure is in contact with both, said substrate and said lower conductive layer.

In an embodiment, the upper conductive layer of said first device overlaps with the lower conductive layer of said second device on or at said intermediate structure, thereby electrically connecting said first and second devices.

In an embodiment, said intermediate structure, when seen in transverse section, is symmetric, preferably substantially rectangular. Preferably, the intermediate structure is provided in direct contact with said lower conductive layer, and is essentially non-conducting and preferably consisting of a non-conducting material.

In an embodiment, said intermediate structure, when seen in transverse section, is asymmetric, preferably presenting the outline of a parallelogram.

In an embodiment, said intermediate structure is deposited so as to be substantially extend in parallel to the border or gap (P1) formed between the lower conductive layers of two neighboring unit devices.

In an embodiment, said intermediate structure is an aid for the deposition of layers said aid being provided for allowing the non-continuous deposition of a layer deposited preferably subsequently to the deposition of said intermediate structure.

In an embodiment, the device of the invention lacks a passivation or other separating layer between the intermediate structure and the lower conducting layer or, if the intermediate structure is deposited on the substrate, between the intermediate structure and said substrate.

In an embodiment, the method comprises depositing said intermediate structure in a single deposition step, so as to obtain said intermediate structure made preferably of a single material. Preferably, the expression "a single deposition step" refers to the uninterrupted, continuous deposition of a particular, defined material. In some embodiments, the single deposition step is provided for producing a deposited structure comprising and preferably consisting essentially of said continuously deposited material.

In an embodiment, the method comprises depositing a single intermediate structure. Preferably, said single intermediate structure is deposited for per each pair of neighboring unit devices, preferably for each pair of neighboring unit devices directly connected in series one with the other.

In an embodiment, the only purpose of said intermediate structure is to serve as an aid provided for allowing the non-continuous deposition of a layer deposited subsequently to the deposition of said intermediate structure.

In an embodiment, the intermediate structure fulfils no function in the operating device and/or could be removed from the device without affection the operation of the device.

The disclosed invention accordingly provides a way for a simple but versatile fabrication method of the interconnection of unit devices within modules. The invention embodiments, combinations of elements and materials, and arrangement of parts that are adapted to affect operation of the invention, all are exemplified in the following detailed disclosure, without limiting the scope of the present inventive concept.

Further aspects and preferred embodiments of the invention are defined herein below and in the appended claims. Further features and advantages of the invention will become apparent to the skilled person from the description of the preferred embodiments given below.

BRIEF DESCRIPTION OF THE DRAWINGS

The accompanying drawings are included to provide a further understanding of the inventive concept. The drawings illustrate exemplary embodiments of the inventive concept and, together with the description, serve to explain principles of the inventive concept, without limiting the scope of the invention.

FIG. 1 is a schematic depiction of a cross-sectional view of a solar cell.

FIGS. 2(a), 2(b) and 2(c) depict schematically the prior-art fabrication steps of a solar module with cells electrically connected in series. Major fabrication steps include P1 patterning of the bottom electrode layer (FIG. 2a), P2 patterning of the electronic layer (FIG. 2b), and P3 patterning of the top electrode layer (FIG. 2c). Material deposition steps are skipped for simplicity.

Figure 3:
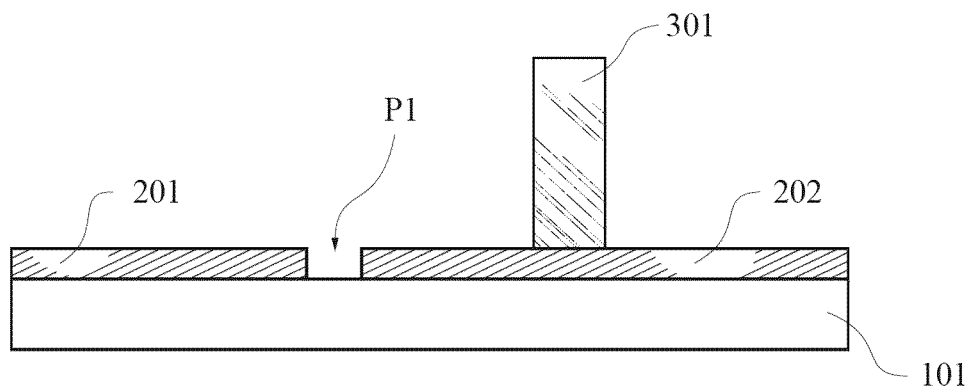
FIGS. 3(a), 3(b) and 3(c) depict schematically the fabrication of a module using insulating intermediate structures in accordance with an embodiment of the invention. Fabrication steps include formation of insulating intermediate structures on top of a patterned bottom electrode (FIG. 3(a)), deposition and patterning of an electronic layer (FIG. 3(b)), and directional deposition of a top electrode (FIG. 3(c)).
Figure 3:
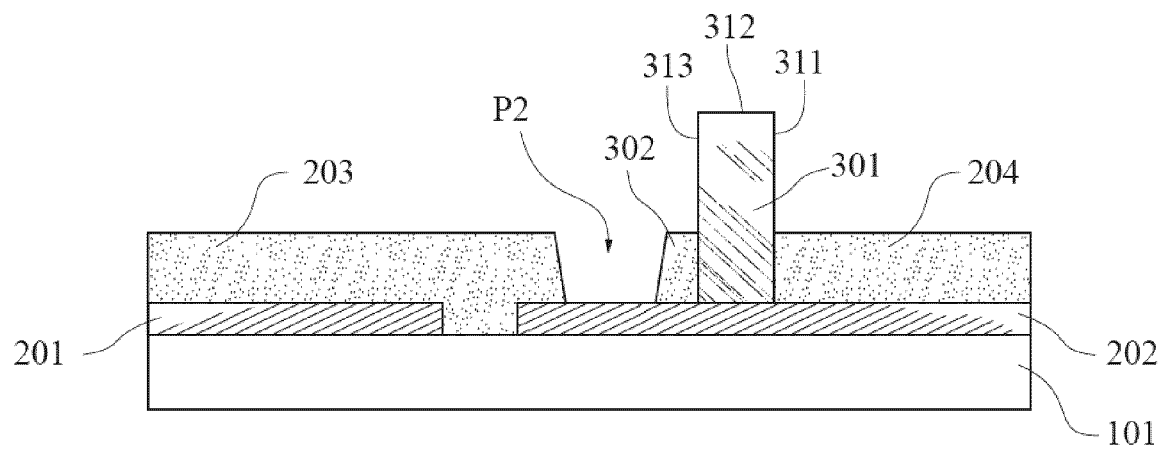
Figure 3:
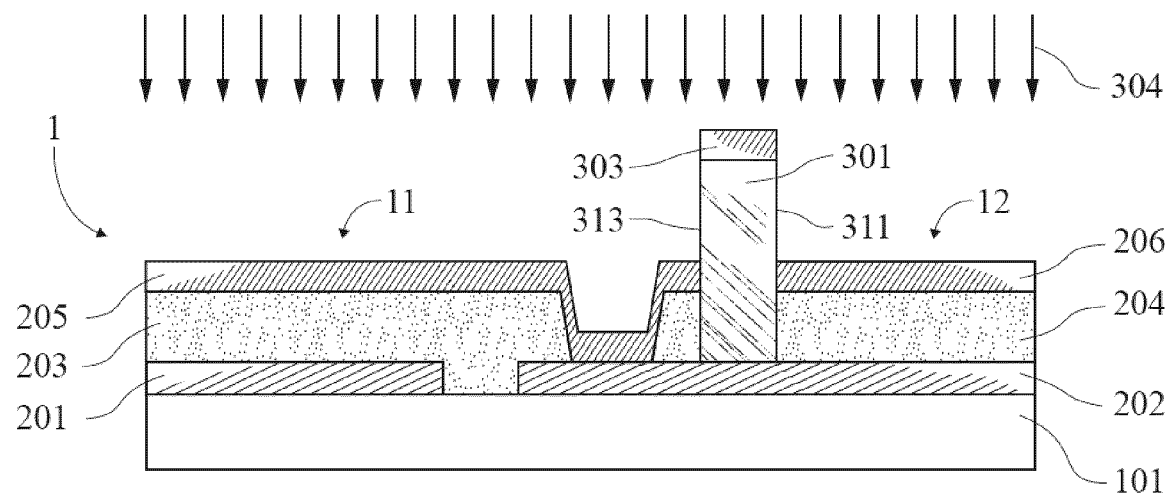

Hereinafter, preferred embodiments of the device of the invention are described, in order to illustrate the invention, without any intention to limit the scope of the present invention.

DETAILED DESCRIPTION OF THE PREFERRED EMBODIMENTS

The present invention relates to a multilayer device and to methods for manufacturing the device. The multilayer device may also be referred to as "module" in this specification. The multilayer device or module preferably comprises a plurality of unit devices, which unit devices are themselves multilayer devices, and which unit devices are electrically connected, for example in series, thereby forming the overall multilayer device or module.

Preferably, the device (and each unit device) comprises at least the following layers: an upper conducting layer, a lower conducting layer and an electronic layer preferably provided between said conducting layers. The lower and upper conducting layers may also be referred to as first and second conducting layers.

The conducting (or conductive) layers comprise a conductive material. For example, the conducting layers may comprise a conductive metal oxide material, a thin metal layer, or various other materials. For example, the conducting layer may also be a conducting polymer.

The conducting layers may also be seen as electrode layers, in particular upper and lower electrode layers. Preferably, current flow enters and exits the device of the invention through the conducting layers.

The electronic layer preferably comprises or consists essentially of a material, including any composition of matter, having semiconducting, photovoltaic, photoelectric and/or electroluminescent properties.

The electronic layer may comprise itself a plurality of layers, depending on the device. For example, the electronic layer may comprise one or more materials selected from the group consisting of: a scaffold material, a nanoporous material, a photovoltaic material, an electroluminescent material, an n-type semiconductor, a p-type semiconductor, a perovskite, a dye, an electrochromic material, a photoluminescent material, a photoelectric material, a buffer, an electron blocking material, a hole blocking material, an electron transporting material, a hole transporting material, an electrolyte, a liquid salt, an active organic layer, and others, for example. One, several or all of these materials are preferably deposited in the form of a layer or film, such as a scaffold layer, a nanoporous layer, a photovoltaic layer, an electroluminescent layer, and so forth, respectively.

The present invention is not limited to a particular electronic layer. The electronic layer may also be considered as the "functional layer", as the layer, layers and/or materials forming the electronic layer generally defines the device type.

For the purpose of the present specification, the term "comprising", and its various grammatical forms, is intended to mean "includes, amongst other". It is not intended to mean consists only of.

The device of the invention preferably is a thin-film device. Preferably, the thin-film device comprising one or more, preferably two or more thin films. For the purpose of the present specification, a "thin film" is a film having a thickness of 20 µm or less, preferably 10 µm or less, more preferably 5 µm or less, and most preferably 2 µm or less. In an embodiment, the thin-film device comprises only, and thus consists of, thin films.

In an embodiment, the device of the invention is selected from solar cells, transistors, LEDs, and OLEDs, preferably from thin-film solar cells, thin-film transistors, thin-film LEDs, and thin-film OLEDs.

In a preferred embodiment, the device of the invention comprises a plurality of unit electronic devices. Said unit devices may be connected in series or in parallel. Preferably, they are connected in series. In case of solar cells, the plurality of unit solar cells may provide a solar cell module.

Preferably, said plurality of unit electronic devices comprise at least a first unit device and a second unit device. Preferably, each unit device is electrically connected with at least one neighbouring unit device. Preferably, as indicated above, the device of the invention comprises many more than one pair of neighboring unit devices. Preferably, the device comprises more than 10, preferably more than 50 and most preferably more than 100 unit devices.

In order to improve the efficiency of a module or device of the invention, for example a solar module or photovoltaic module, the plurality of individual unit devices are usually intended to be connected in series via interconnects within the module. A set of electrical connections between the top and bottom electrode of the neighbouring cells is an example of such interconnect structures.

In an embodiment, the method of the invention comprises a plurality of method features. These method features preferably are but need not in all cases be performed as separate method steps. The invention does not exclude that some method features are performed simultaneously. Furthermore, the present invention is not to be interpreted to impose a particular order of steps, and the steps may thus be conducted in any order, unless a particular order is indicated or can be directly inferred with respect to some, several or all steps of the method.

FIGS. 3(a)-3(c) illustrate an embodiment of the method for producing the device of the invention, and FIG. 3(c) shows an embodiment of the device of the invention as obtained by the exemplary method. FIG. 3(c) may be considered to be a solar cell, but may be selected from other devices, preferably thin-film devices.

The device of the invention preferably comprises a substrate 101. The substrate 101 may be transparent, semitransparent, or opaque, for example. It may comprise or consist essentially of such materials as glass, silicon, various metals, plastics or other rigid materials. However the substrate 101 may also be flexible and may comprise or consist essentially of bendable ultrathin glass, metal foil or a polymer. In some embodiments, the substrate is a non-conducting base layer.

In an embodiment of the invention, the substrate 101 provides a flat, planar, and/or even surface. Preferably, the substrate 101 provides an unstructured surface on which the lower conductive layer 201, 202 and further components, as appropriate, are provided.

In an embodiment, the substrate 101 is substantially flat and even between neighbouring unit devices 11, 12. Preferably, the substrate is continuously even and flat between neighboring unit devices. This does not exclude the possibility of irregularities and damages occurring during the manufacturing (e.g. during etching or scribing) and affecting the preferably evenness of the substrate.

The method of the invention preferably comprises providing a substrate and/or a non-conducting base layer 101; depositing a lower or first conducting layer 201, 202 and, optionally, patterning said lower conducting layer 201, 202 so as to obtain a plurality of electrically separated conducting layers 201, 202.

In an embodiment, the lower conductive layer is deposited on the unstructured surface of the substrate 101 so as to have a flat lower surface in continuous contact with the substrate.

In some embodiments, the invention does not include the deposition of a lower conducting layer 201, 202. In these embodiments, the step of depositing a lower conductive layer is not applicable. The reason is that in some embodiments, such as those illustrated in FIGS. 3(*a*)-(*c*) and FIGS. 4(*a*)-(*c*), it is in principle possible to use commercially available substrates, which already have a conducting layer deposited thereon, such that the method of the invention may directly comprise providing a substrate 101 comprising a (first or lower) conducting layer. Such commercially available substrates may include transparent conductive substrates, such as substrates on which a transparent conductive oxide (TCO) or any other transparent conducting electrode is deposited. One may also envisage that patterned conductive substrates, such as shown in FIG. 2(*a*) are commercially obtained, such that the optional step of patterning said lower conducting layer 201, 202 may be omitted (or replaced) by directly providing patterned or scribed conductive substrates. These possibilities discussed in this paragraph do generally not apply to embodiments where the intermediate structure is deposited before the first conducting layer.

For the purpose of the present specification, the terms "before" and "after" refer to relative moments in time and are thus intended to mean "temporally before" and "temporally after".

In some embodiments, the invention provides intermediate structures 301, which are schematically illustrated in FIGS. 3(*a*)-(*c*). These figures shows the schematic cross section of a region of the device module at some of the stages during the process of the module fabrication using insulating intermediate structures 301. As mentioned above, other devices and in particular thin-film devices are encompassed by the present invention, and the example of a solar cell may be used for the purpose of illustration.

Some general statements may be made with respect to preferred embodiments of the intermediate structure:

In a preferred embodiment, the intermediate structure 301 is provided on said substrate 101 and/or on said lower conductive layer 202.

In a preferred embodiment, the intermediate structure 301 extends above and/or from a surface of said substrate 101 or of said lower conductive layer 201, 202, thereby providing a projection on said surface or on said lower conductive layer 201, 202.

In a preferred embodiment, the intermediate structure 301 comprises one or more selected from the following characteristics:
 (i) the intermediate structure comprises a material that is different from the material forming said substrate 101,
 (ii) said intermediate structure 301 is a structure that is distinct from said substrate (101), and,
 (iii) said intermediate structure 301 is a deposited material.

Regarding point (ii) above, the intermediate structure 301 is preferably not formed in one piece with the substrate 101. Nevertheless, the intermediate structure 301 is preferably connected, for example via conductive layer 202, to the substrate 101 (see also FIGS. 5(*a*)-5(*c*) to be discussed below, where the intermediate structure is provided directly on the substrate).

In an embodiment, the method of the invention comprises providing said substrate 101 and depositing a lower conducting layer 201, 202. The method may comprise patterning said lower conducting layer so as to obtain a plurality of electrically separated conducting layers 201, 202. Patterning is preferred in embodiments (FIGS. 3(*a*)-(*c*) and 4(*a*)-(*c*) where the lower conducting layer is deposited before depositing an intermediate structure.

In aspects of the invention comprising the deposition of a first or lower conducting layer, the are embodiments where the lower conducting layer is deposited before the deposition or formation of the intermediate structure and embodiments where the intermediate structure is deposited or formed before the deposition of the lower conducting layer.

In embodiments where the lower conducting layer is deposited before the intermediate structure, the intermediate structure may be deposited at least partially on said lower conducting layer.

In embodiments where the intermediate structure is deposited before the lower conducting layer, the intermediate structure may be deposited directly on the substrate.

Preferably, the at least one electronic layer is deposited after both, the lower conducting layer and the intermediate structure have been deposited, although one may envisage (and the invention does not wish to exclude) that the electronic layer is first and partially removed, for example by scribing or etching, before the deposition of the intermediate structure.

In the embodiment shown in FIGS. 3(*a*)-(*c*) and 4(*a*)-(*c*), depositing a lower conducting layer 201, 202 is performed before depositing said intermediate structure 301, 401 on said substrate 101. Said intermediate structure 301, 401 is preferably partially or totally deposited on said lower conducting layer 101.

Figure 5:
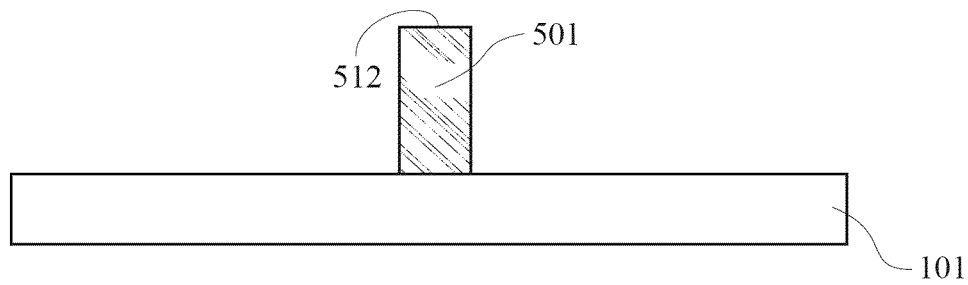
FIGS. 5(a), 5(b), 5(c), and 5(d) depict schematically the fabrication of a module using intermediate structures and oblique deposition of conducting layers. Fabrication steps include the formation of an intermediate structures (FIG. 5(a)), the oblique deposition of a bottom conducting layer (FIG. 5(b)), the deposition of an electronic layer (FIG. 5(c)), and the oblique deposition of a top conducting layer (FIG. 5(d)).
Figure 5:
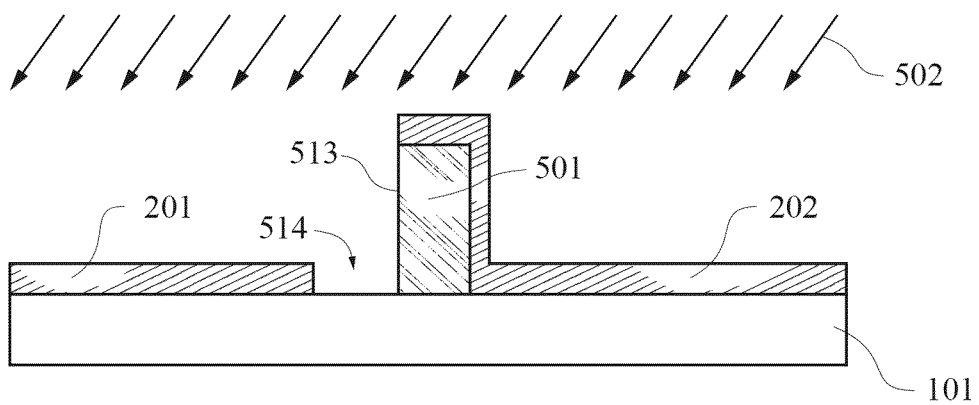
Figure 5:
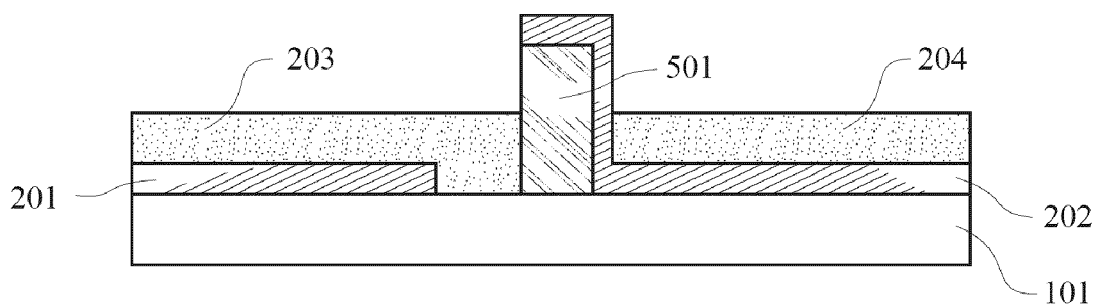
Figure 5:
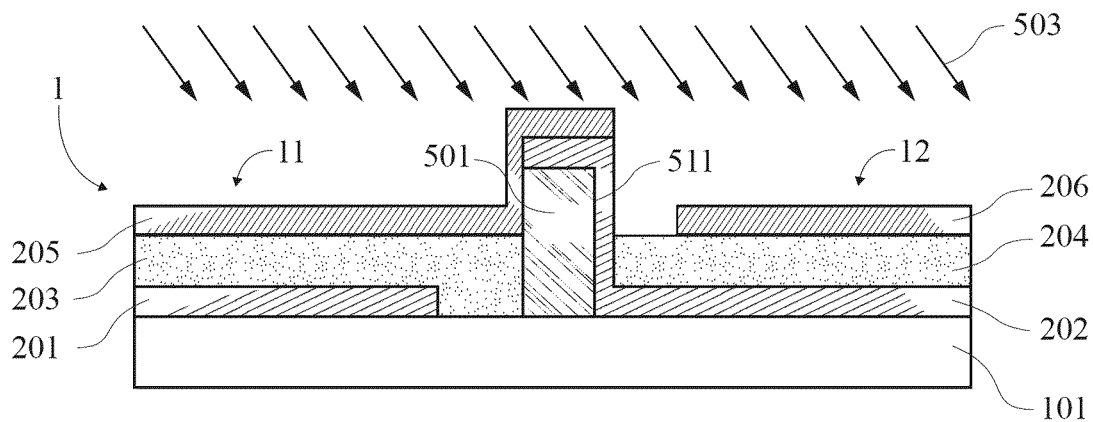

In embodiments where the intermediate structure 501 is deposited before the lower conducting layer is deposited (FIGS. 5(*a*)-(*d*)), patterning, such as scribing insulating lines, may be omitted, since the electrically separated lower conducting layers 201, 202 can be obtained by selecting an appropriate deposition direction or angle when depositing the lower conducting layers 201, 202.

Turning back to the embodiment specifically shown in FIGS. 3(*a*)-(*c*), a bottom electrode layer pre-deposited and pre-patterned into electrically isolated regions 201, 202 is provided, so that insulating intermediate structures 301 may be formed on top of this layer as shown in FIG. 3(*a*). In this embodiment, the intermediate structure comprises or essentially consists of an insulating material.

The P1 pattern, which may be realized in the form of the scribing lines in the bottom electrode layer, is defining the position of unit cells within the overall device or module.

As visible in FIG. 3(a), electrode region 201 defines a bottom electrode for the left or first unit device 11, and region 202 defines a bottom electrode for the right or second unit device 12. Patterning of the bottom electrode layers may be performed with laser scribing as was described hereinabove. In this case no alignment is needed since it is the first patterned layer. The P1 pattern may also be formed during the deposition of the bottom electrode layer, for example using an appropriate shadow or stencil mask during the deposition of the bottom conducting layer, resulting in the P1 patterning.

The P1 pattern or scribing line may be conducted before, after or possibly at the same time as depositing the intermediate structure 301.

In other embodiments, similar patterning of the electrode layer may be performed by means of wet or dry etching with a polymer mask formed by photolithography. In this case, insulating intermediate structures may be formed by performing another step of photolithography using the same photomask or photolithography layout as at the preceding lithography step, but slightly shifted, preferably in a direction perpendicular to the P1 lines.

In an embodiment, the method of the invention comprises depositing an intermediate structure 301, 401, 501 on said substrate 101 (FIG. 5(a)) or, if said lower conducting layer 201, 202 has been previously deposited (FIGS. 3(a) and 4(a)), at least partially on said lower conducting layer 201, 202.

In an embodiment of the method of the invention, said intermediate structure 301, 401 comprises a conducting material or an insulating material, wherein depositing said intermediate structure 301, 401 is conducted after depositing said lower conductive layer 202, and wherein depositing said intermediate structure 301, 401 comprises depositing said intermediate structure 301, 401 so as to be in contact with a lower conductive layer 202 of a second device 12 and being separate (or apart from) from a lower conductive layer 201 of a first device 11.

To be "in contact with" means preferably "direct physical contact", whereas "separate" means that there is no "direct physical contact". For example, in FIGS. 3(a)-(c) and 4(a)-(c), the intermediate structure 301, 401 is separate and thus not in direct physical contact with the lower conductive layer 201 of the first device 11. "Direct physical contact" implies electrical contact, whereas the goal of "separate" is to have no electrical contact.

Of course, the intermediate structure may be in contact with the lower conductive layer of the first device and separate from the lower conductive layer of second device, it being preferred, in accordance with this embodiment, that the intermediate structure is in contact with the lower conductive layer of only one out of two neighboring, directly adjacent devices connected in series.

In certain embodiments, SU-8 or other photoresists may be used as the material for formation of insulating intermediate structures 301. Employment of the photoresist allows simple way for formation of the intermediate structures with controllable undercut profile, which is providing a relatively large shadowing area on the surface. However other insulating materials may be also used for this purpose.

In an embodiment, the method of the invention comprises depositing at least one electronic layer 203, 204 comprising a material having semiconducting, photovoltaic, photoelectric and/or electroluminescent properties. Preferred embodiments of the "electronic layer" or "functional layer" have already been set out herein above.

Regarding the embodiment shown in FIGS. 3(a)-3(c), forming insulating intermediate structures 301 on the patterned bottom electrode layer 201, 202 as in FIG. 3(a), is preferably followed by the deposition and consequent patterning of the electronic (e.g. photovoltaic) layers 203, 204, 302 as schematically presented in FIG. 3(b).

Deposition techniques used to form the electronic layer may depend on the used unit cell technology. In case of traditional solid-state technology, various physical vapor deposition techniques with directional material flow may be employed. While in the case of organic unit devices, organic active layers may be deposited with various solution-based coating techniques like printing techniques, spray coating, casting, blade coating and others. However, other deposition techniques not mentioned above may be employed as well for electronic layer deposition.

In an embodiment, the method of the invention comprises, after depositing said electronic layer 203, 204, patterning said electronic layer 203, 204 so as to obtain gaps P2 in said electronic layer 203, 204 and to expose a surface of said lower conducing layer 202 in said gaps P2.

Patterning techniques applied to the electronic layer may also vary depending on the particular embodiment. For example, an etching process with a photoresist mask may be employed. In this case the same or similar photolithography mask may be used, as for preceding steps of bottom electrode layer patterning and for formation of the intermediate structures. Also, etching of the electronic layer may be performed with laser scribing technique. As schematically represented in FIG. 3(b), the scribing line P2 of the electronic (e.g. photovoltaic) layer should be realized between the scribing line P1 of the electrode layer and the intermediate structure 301. Some degree of overlapping may be tolerated though.

As a result of the electronic layer patterning, the regions of this layer 203 and 302 in FIG. 3(b) become separated by a gap P2. This gap opens an access to the bottom electrode 202, and is further employed for electrical connection with the top electrode layer. Also depending on the deposition technique used to deposit the electronic layer, some materials of this layer may accumulate on the intermediate structures 301 (similar to 303, but is not illustrated in FIG. 3(b)). In FIGS. 3(b) and (c), the intermediate structure also separates regions 204 and 203 of the electronic layer.

In an embodiment, the method of the invention comprises depositing an upper conducting layer 205, 206 on top of said electronic layer 203, 204, wherein during depositing said upper conducting layer 205, 206 said intermediate structure 301, 401, 501 provides a shaded area and/or separation structure.

As schematically illustrated in FIG. 3(c), the deposition and consequent patterning of the electronic layer are followed by the deposition of the top electrode layer 205, 206, 303. While the material choice for the top electrode layer is similar as was listed for the bottom electrode, the deposition technique should preferably yield directional flow of the material 304. In accordance with a preferred embodiment of the invention, directional deposition leads to the fracturing of the deposited layer along the intermediate structure 301 into electrically disconnected regions due to the shadowing effect of the intermediate structures.

Preferably, in accordance with the method of the invention, the deposition direction or angle is adjusted, kept constant and/or otherwise controlled such that during depositing said upper conducting layer, a plurality of separated upper conducting layers 205, 206 is obtained, said separated upper conducting layers 205, 206 being electrically separated. This is preferably achieved by said intermediate structure 301, which provides a shaded area and/or separation structure, separating said upper conducting layers.

In an embodiment of the method of the invention, depositing said upper conducting layer 205, 206 comprises keeping, selecting and/or adjusting a deposition direction and/or angle such that said upper conducting layer 205, 206 is non-continuously deposited on said electronic layer 203, 204 and/or on said intermediate structure 301, 401, 501.

The deposition angle is the direction of the material deposition with respect to the planar surface of the substrate 101. In FIG. 3(*c*), the deposition angle is kept at 90° with respect to the substrate 101. The deposition angle or direction may also be defined with respect to the direction of at least one lateral side 311, 313 of the intermediate structure.

In an embodiment of the method of the invention, depositing said upper conducting layer 205, 206 comprises keeping, selecting and/or adjusting a deposition angle such that said upper conducting layer 205, 206 is deposited so as to partially cover an exposed surface of an intermediate structure 301, 401, 501. In FIG. 3(*b*), the sides 311, 312 and 313 are exposed sides of the intermediate structure. As can be seen in FIG. 3(*c*), side 312 was covered entirely by material 303 and sides 312 and 313 are only partially covered by the deposited materials 205 and 206, respectively.

In an embodiment of the method of the invention, depositing said upper conducting layer 205, 206 comprises keeping, selecting and/or adjusting a deposition angle such that at least one lateral side 311, 411 of the intermediate structure 301, 401, 501 remains at least partially free from deposited upper conductive material. Preferably, the part that remains free from deposited upper conductive material provides and/or defines an electrical separation between the upper conductive layers 205, 206 of said first and second unit devices 11, 12.

In the embodiment shown in FIG. 3(*c*) (and also 4(*c*) and 5(*d*)), the intermediate structure 301 is provided between the upper conducting layers 205, 206 of two neighbouring unit devices 11, 12, whereby the intermediate structure 301 contributes to provide a separation between said upper conducting layers 205, 206 and to prevent current flow between said upper conductive layers 205, 206 of two neighbouring unit devices 11, 12.

Depending on the deposition direction and on the shape of the intermediate structure, the region of the top electrode layer 303 may be connected either to 205 or to 206. However, region 303 should not be connected to both regions 205 and 206 simultaneously, since it may cause electrical shortcuts between neighboring unit devices, reducing the overall efficiency of the solar module.

As a result of the steps described above, the top electrode 205 of the left or first unit device 11 becomes electrically connected to the bottom electrode 202 of the right or second unit device 12 through the gap P2. In the larger scale, plurality of unit devices within the overall module become electrically connected in series ensuring ability of current circulation in the module.

The above described steps represent an example of the fabrication process of the described embodiment for better comprehension of the idea and spirit of the invention. Nevertheless, other techniques may be also employed for the realization of the presented embodiment without departing from the spirit of this disclosure. Without wishing to be bound by theory, the general idea of the embodiment shown in FIGS. 3(*a*)-(*c*) is to use insulating intermediate structures regardless of their shape and compound materials in order to cause discontinuity of the top electrode layer between neighboring unit devices (e.g. solar cells) within the module. Presented above embodiment removes necessity in the P3 patterning of the top electrode layer, see FIGS. 2(*a*)-(*c*). This is an important advantage, since P1 and P2 scribing lines are less challenging for realization, but the P3 scribing process is the most complicated from the technical aspects, and therefore the most impacting on the production cost.

Figure 4:
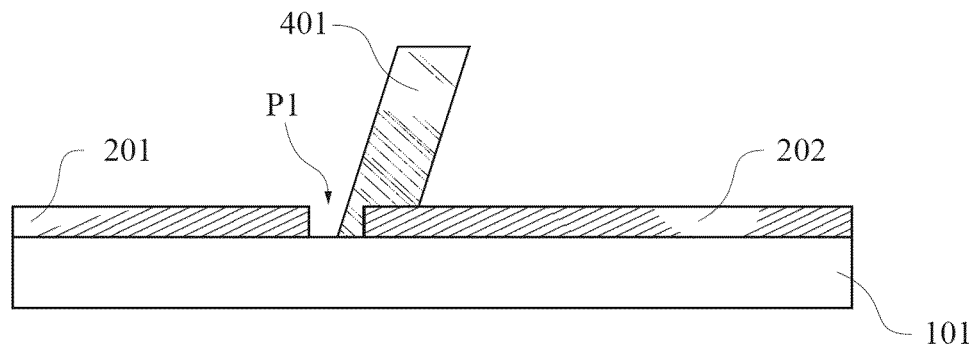
FIGS. 4(a), 4(b) and 4(c) depict schematically the fabrication of a module using conducting oblique intermediate structures in accordance with an embodiment of the invention. Fabrication steps include the formation of the conducting oblique intermediate structures on top of the patterned bottom electrode (FIG. 4(a)), the deposition of the electronic layer (FIG. 4(b)), and the directional deposition of the top electrode (FIG. 4(c)).
Figure 4:
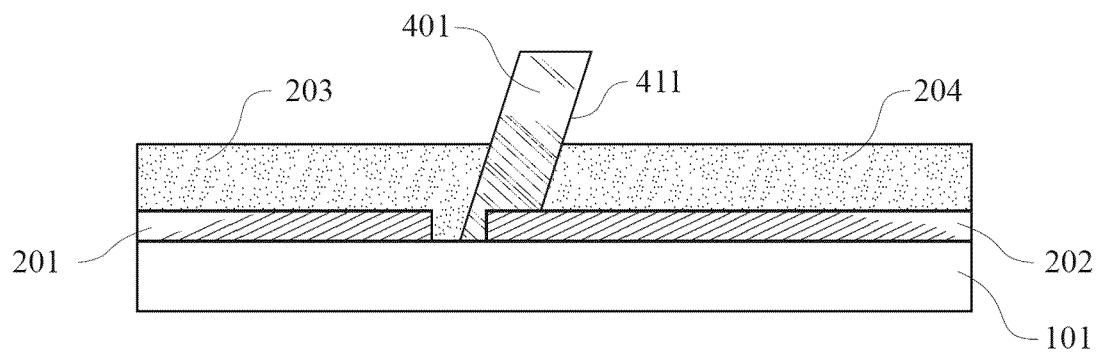
Figure 4:
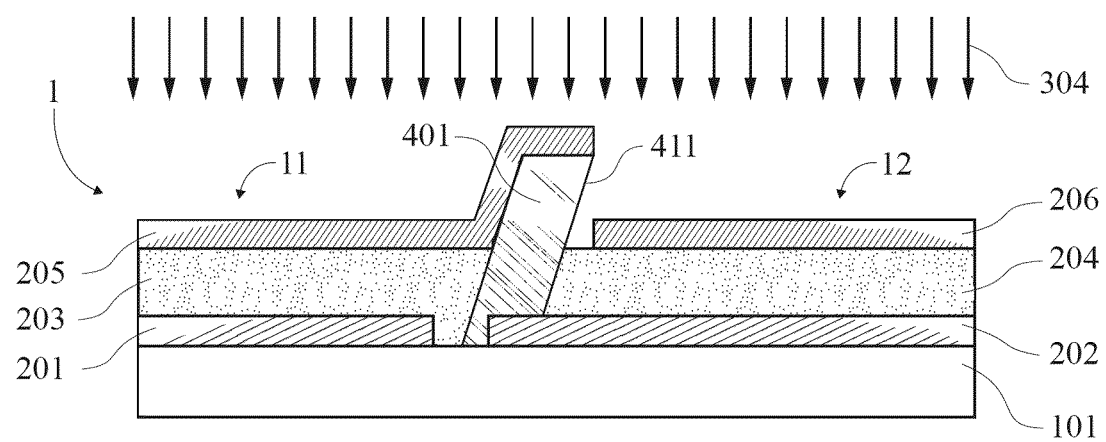

In some embodiments, the intermediate structure comprises a conducting material. In these embodiments, the intermediate structure is preferably conducting. Such an embodiment is schematically illustrated in FIGS. 4(*a*)-(*c*). These figures show the schematic cross section of a region of the device at some of the stages during the process of the device fabrication using conducting intermediate structures 401.

For the embodiment shown in FIG. 4(*a*), a bottom electrode layer which is pre-deposited and pre-patterned into electrically isolated regions 201, 202 is provided, so that conducting intermediate structures 401 may be formed on top of this layer as shown. The P1 pattern, which may be realized in the form of the scribing lines in the bottom electrode layer, is defining the position of unit devices within the module. In FIG. 4(*a*), electrode region 201 defines the bottom electrode for the left or first unit device or cell 11, and region 202 defines bottom electrode for the right or second unit device or cell 12. Patterning of the bottom electrode layer may be performed with methods described for the previous embodiment, wherein the relative alignment of the patterned gaps P1 of the bottom electrode layer and the intermediate structures is not important. However these conducting intermediate structures 401 should not electrically connect otherwise isolated parts 201, 202 of the bottom electrode layer by crossing the patterned gap, since it may cause electrical shortcut between neighboring unit devices, reducing the efficiency of the overall module comprising the plurality of unit devices.

In an embodiment of the method of the invention, depositing said intermediate structure 401 comprises depositing at least part of said intermediate structure 401 so as to comprise an oblique or curved profile, when seen in cross-section of said intermediate structure 401, said oblique or curved profile providing a shading or separation area on said substrate 101 or on said lower conducting layer 201, 202.

As illustrated in FIGS. 4(*a*)-(*c*), the preferred shape of the intermediate structures 401 is tilted towards the opposite side of the P1 gap, providing a shadow area for further deposition of the top electrode layer. However other profiles may also be used, including tapered or curved, preferably at least inwardly and/or concave profile. Also a straight rectangular profile (like the one illustrated in FIG. 3(*c*), 301) is possible, if employed together with oblique deposition of the top electrode layer that will be presented hereafter (FIG. 5(*d*)).

The shaded area is not indicated with a reference number in FIGS. 4(*a*)-(*c*), but it can be seen as the area of the upper surface of the electronic layer 204 of the second device 12 that is not covered by the upper conducting layer 206.

In an embodiment, the intermediate structure 401, when seen in transverse section, comprises a lateral side 411 at least part of which is oblique and/or curved with respect to the surface of the substrate.

Preferably, at least part of the lateral side 411 provides an overhang projection on said substrate 101 or on said lower conducting layer 202. Preferably, at least a section of the line defining side 411, when seen in transverse section (as in FIGS. 4(a)-(c)) extends at an angle that is <90° with respect to the surface of the substrate. In case the profile line defining side 411 is curved, the tangent at a least one point of the curved line extends at an angle that is <90° with respect to the surface of the substrate.

Conducting intermediate structures 401 as shown in FIGS. 4(a)-(c) may be formed using various techniques. For example, they can be deposited by means of physical vapor deposition of a conducting material and consequent lift-off process, or by electroplating deposition of a metal. For both options, a photoresist mask may be employed to define regions where the intermediate structures are to be formed. This photoresist mask may be defined by a photolithography step using the same photolithography mask or photolithography layout as at the preceding photolithography step, but slightly shifted, preferably in the direction perpendicular to the P1 lines. Alternatively, the photolithography mask may be formed initially on the rear side of the substrate, with the following step of the photolithography that defines the P1 pattern being performed by UV exposure from the rear side of the substrate. The above mentioned shift in the photolithography patterns between first and second exposures may be achieved by performing consequent exposure obliquely. In this way, the exposed pattern that defines the intermediate structures is shifted with respect to the P1 pattern. The corresponding shift is determined by the thickness of the substrate, and by the angle of the oblique exposure direction.

In order to achieve a tilted profile of the intermediate structures, additional sacrificial structures with tapered profile may be employed. These temporal structures may assist formation of the slope of conducting intermediate structures during the deposition process and should be stripped at the following step. For example, such sacrificial structures may be made of a photoresist material. For this purpose a layer of a photoresist is to be exposed employing photolithography. In order to simplify the fabrication process, the exposure pattern may be defined using the same photolithography mask or photolithography layout as at the preceding photolithography step, but slightly shifted, preferably in the direction perpendicular to the P1 lines. The tapered profile of the photoresist edges may be achieved by adapting the exposure, or by employing a photoresist reflow technique, or by employing other suitable techniques. Having a photoresist layer with sloped edges, the deposition of the intermediate structures 401 may be performed. In case the intermediate structures are deposited by means of electroplating, the part of the bottom conducting layer 202 that is not covered by photoresist may be employed as a cathode for the material deposition. As a result, the deposited conducting material will be tilted along the slope of the photoresist edge. After completing the deposition of intermediate structures, the sacrificial layer may be removed. If a sacrificial layer is made of photoresist, it can be removed by acetone, or other organic solvent, or specific photoresist stripping agent.

As shown in FIG. 4(b), the following step is to deposit an electronic (e.g. photovoltaic) layer, similarly to the embodiment described before. However, in this embodiment the P2 scribing line is not required, as the electronic layer becomes divided by the intermediate structures 401 into separated parts 203, 204, as visible in FIG. 4(b). Also, depending on the deposition technique, and depending on the profile of the intermediate structures, another separated part of the electronic layer may form on the top of the intermediate structure, not illustrated in FIGS. 4(b)-(c).

As shown in FIG. 4(c), the following step is to deposit a top electrode layer. Similar techniques may be employed as to the embodiment described before. The deposition technique should preferably yield directional flow of the material 304, which leads to the fracturing of the deposited top electrode layer along the intermediate structure into electrically disconnected regions 205, 206 due to the shadowing effect of the intermediate structures. Moreover, due to the shape of the conducting intermediate structure 401, it becomes electrically connected to the region of the top electrode 205, while being separated from the opposite region of the top electrode 205. As said, the intermediate structure 401 should not be connected to both regions 205 and 206 simultaneously, since it may cause electrical short-cuts between neighboring unit devices, reducing the overall efficiency of the module.

In an embodiment, depositing said upper conducting layer 205, 206 comprises keeping, selecting and/or adjusting a deposition direction and/or angle such that the upper conductive layer 206, 205 of said first device 11 or of said second device 12 is separated from said intermediate structure 401, 501.

As the result of the steps described above, the top electrode of the left cell 205 becomes electrically connected to the bottom electrode of the right cell 202 through the conducting intermediate structure 401, while bottom electrodes 201 and 202 are isolated by the gap P1, and top electrodes 205 and 206 are isolated by the discontinuity in the top electrode layer produced by the intermediate structure shading effect during the deposition process. In the larger scale, plurality of unit devices (e.g. solar cells) within the module become electrically connected in series ensuring ability of current circulation in the module.

FIG. 4(c) provides an embodiment of the present invention, wherein the intermediate structure 401 comprises a conductive material, and wherein the intermediate structure 401 is provided to electrically connect the upper conductive layer 205 of said first unit device 11 with the lower conductive layer 202 of said second unit device 12.

The above described steps represent an example of the fabrication process of the described embodiment for better comprehension of the idea and spirit of the invention. Nevertheless, other shapes of the intermediate structures and other fabrication techniques may be also employed for the realization of the presented embodiment without departing from the spirit of the inventive concepts. The general idea of this embodiment is to use a conducting intermediate structures, the exact shape and compound materials of which may be selected as appropriate, in order (a) to cause discontinuity of electronic layer between neighboring unit devices, (b) to cause discontinuity of the top electrode layer between neighboring unit devices, (c) to provide electrical connection between top and bottom electrodes of the neighboring unit devices within the overall device or module comprising the unit devices.

The embodiment in FIGS. 4(a)-(c) removes the necessity of the P2 and P3 patterning steps of the electronic layer and top electrode layer, respectively. This is preferable, since the P1 scribing line that is the only one that still needs to be performed is the simplest one when considering technical aspects, since the P1 scribing does not require precise alignment, and can be performed by various methods.

In the embodiment shown in FIGS. 3(a)-(c), the intermediate structure preferably comprises or essentially consists of an insulating material. In this embodiment, the intermediate structure is preferably effectively insulating, in particular electrically insulating. In other embodiments, such as in the embodiment illustrated in FIGS. 4(a)-(c), the intermediate structure preferably comprises or essentially consists of an electrically conductive material. In yet other embodiments, e.g. as shown in FIGS. 5(a)-(d), the conductive or insulating properties of the intermediate structure is not relevant, and in such cases the intermediate structure may be made from any type of material, including semiconducting materials, for example.

In a general manner, not limited to the embodiment shown in FIGS. 3(a)-(c), the intermediate structure 301, 401, 501, may be longitudinally extending between neighbouring unit devices 11, 12. The longitudinal dimension of the intermediate structure 301 is not directly recognizable in FIGS. 3(a)-(c), but one can understand that it preferably extends at least along the entire adjacent sides of the first and second devices 11, 12. In this embodiment, where the intermediate structure 301 is made from an insulating material, the intermediate structure prevents a direct contact between upper conductive layers 205, 206. In order to electrically separate the upper conductive layers 205, 206 of the first and second unit cells 11, 12, the intermediate structure 301 preferably extends along the entire upper layer of at least the first and/or the second device.

FIGS. 5(a)-(d) illustrate a further embodiment of the invention. In this embodiment, scribing lines, such as lines P1, P2 and P3 shown in FIGS. 2-4 may be omitted entirely, and so is a step of making such lines, through scribing, patterning, and the like.

For this embodiment intermediate structures 501 are preferably formed prior to the deposition of the bottom electrode layer, as schematically demonstrated in FIG. 5(a). These intermediate structures may be fabricated by any of the deposition methods described hereinabove or by other methods. These intermediate structures may be conducting, insulating, or semiconducting. These intermediate structures may have rectangular, tapered or negative-tapered profiles.

In an embodiment of the method of the invention, depositing an intermediate structure 501 on said substrate 101 is conducted before depositing said lower conducting layer 201, 202. Preferably, during depositing said lower conducting layer 201, 202, an angle or direction of deposition is adjusted such that said lower conducting layer 201, 202 is deposited so as to partially cover an exposed surface 511, 512, 513 of said intermediate structure 501.

As illustrated in FIG. 5(b), the formation of intermediate structures is followed by the oblique deposition of the bottom electrode layer 201, 202. The term oblique deposition is referring to a deposition technique with a flow of material 502 in a direction that is constantly less skewed than the slope of the incident sidewall 511, and more skewed than the slope of an opposite sidewall 513 of the intermediate structure 501. More or less skewed preferably refers to the angle with respect to the substrate.

As a consequence of the oblique deposition as defined, the deposited layer appears in direct contact with the intermediate structure from the incident side 511, while a shadowing effect results in the fracturing of the deposited bottom electrode layer from the opposite side 513 of the intermediate structure. In this way, a gap between 201 and 501 is obtained that electrically isolates regions of the bottom electrode and defines bottom electrodes for independent, separate and preferably neighboring unit devices 11, 12. Therefore the term oblique should be perceived not as an absolute term but as a relative term, that is referring to the relative angle between the direction of the material flow and the slopes of the sidewalls of the intermediate structures.

The term "opposite sidewall" is referred to the sidewall neighboring the realized gap 514 in the bottom electrode layer, that is the left sidewall in the FIGS. 5(a)-(d). This means that oblique deposition can be also performed in the direction normal to the substrate surface if at least one of the sides of the intermediate structures has an undercut (oblique, curved or concave) profile, if the shadowing effect is sufficient for gap formation in the bottom electrode layer, as illustrated with respect to FIG. 4(c). Similar deposition techniques may be employed as to the deposition of the top conducting electrodes of the embodiments described before.

Referring to the schematic presented in FIG. 5(b), the flow of material 502 is incident to the right sidewall 511, so that the right region of the bottom electrode 202 becomes connected to the intermediate structure 501, and the gap 514 in the bottom electrode layer appears on the left side of the intermediate structure 501, rendering the left region of the bottom electrode 201 to be separated from both the intermediate structure 501 and the right region of the bottom electrode 202.

As illustrated in FIG. 5(c), the following step is to deposit an electronic (e.g. photovoltaic) layer 203, 204. Similar techniques may be employed as to the embodiment described before. However, a P2 scribing line is not required in this case, as the electronic layer becomes divided by the intermediate structure 501 into separated parts 203, 204. Also, depending on the deposition technique, and depending on the profile of the intermediate structure, another separated part of the electronic layer may form on the top of the intermediate structure, not shown in FIGS. 5(c)-(d).

As illustrated in FIG. 5(d), the precedent fabrication step is to be followed by an oblique deposition of a top electrode layer. A directional flow of material 503 is to be incident to the intermediate structures' sidewall 513 which is adjacent to the gap 514 in the bottom layer 201.

Similarly to the remarks made with respect to the deposition of the bottom electrode layer, the term "oblique deposition" should be perceived not as an absolute term but as a relative term, that is referring to the relative angle between the direction of the material flow and slopes of sidewalls of the intermediate structure. As a result of such oblique deposition, the top electrode layer 205 will be in contact with the incident sidewalls of the intermediate structures, while the opposite sidewalls should be more steep than the direction of the material flow 503, and therefore cause fracturing of the deposited top electrode layer along the intermediate structure into electrically disconnected regions 205, 206 due to the shadowing effect of the intermediate structures discussed hereinabove.

Referring to the schematic presented in FIG. 5(d), the flow of material 503 is incident to the left sidewall 513 of the intermediate structure 501, so that the left region of the top electrode 205 becomes connected to the intermediate structure 501, and the gap in the top electrode layer appears on the right side of the intermediate structure 501, making the right region of the top electrode 206 to be separated from both the intermediate structure 501 and the left region of the top electrode 205. While an intersection between top electrode 205 and bottom electrode 202 is illustrated in FIG. 5(d), such intersection is not compulsory if the intermediate structure is conducting. In case of a conducting intermediate structure, electrodes 205 and 206 will be electrically connected to each other if they are both in contact with the intermediate structure 501. However, if an insulating intermediate structure is employed, electrodes 205 and 202 are required to be in contact with each other in order to assure electrical connection between them.

As the result of the steps described above, the top electrode 205 of the left or first device 11 becomes electrically connected to the bottom electrode 202 of the right or second device 12 either through the conducting intermediate structure 501, or by direct electrical contact between 205 and 202. Bottom electrodes 201 and 202 are isolated between each other by the self-patterned gap produced by the intermediate structure shading effect during the deposition process of the bottom electrode, while top electrodes 205 and 206 are isolated between each other by the self-patterned gap in the top electrode layer produced by the intermediate structure shading effect during the corresponding deposition process. In the larger scale, plurality of unit devices within the overall device become electrically connected in series ensuring ability of current circulation in the device.

In an embodiment of the device of the invention, the upper conductive layer 205 of said first device 11 is connected with the lower conductive layer 202 of said second device 12 on or at said intermediate structure 501.

In an embodiment, the intermediate structure 501 is provided between the lower conductive layers 201, 202 of two neighbouring unit devices 11, 12, whereby the intermediate structure 501 contributes to provide a separation between said lower conducting layers and to prevent current flow between said lower conductive layers 201, 202.

The above described steps represent an example of the fabrication process of the described embodiment for better comprehension. Nevertheless, other shapes of the intermediate structures and other fabrication techniques may be also employed for the realization of the presented embodiment without departing from the spirit of this inventive concept. The general idea of the embodiment shown is to use intermediate structures regardless of their shape and compound materials in order (a) to cause discontinuity of the bottom electrode layer between neighboring unit devices, (b) to cause discontinuity of electronic layer between neighboring unit devices, (c) to cause discontinuity of the top electrode layer between neighboring unit devices, and (d) to assure electrical connection between top and bottom electrodes of the neighboring unit devices within the module. The embodiment illustrate at the example of FIGS. 5(a)-(d) removes necessity in the P1, P2 and P3 patterning steps of the layers of the unit devices, see FIGS. 2(a)-(c), due to the self-patterning of these layers that relies on the shadowing effect of the employed intermediate structures. Therefore, the disclosed invention has a potential for cost reduction and efficiency improvement in the device production.

In an embodiment, for example illustrated in FIGS. 4(a)-(c) and 5(a)-(d), the intermediate structure 401, 501 comprises a material selected from a conducting, semiconducting and insulating material, wherein said the intermediate structure 501 is partially or totally provided on the substrate, wherein:
the lower conductive layer 201 of said first unit device 11 is spaced apart from said intermediate structure 501, and/or,
the upper conductive layer 206 of the second unit device 12 is spaced apart from said intermediate structure 501.

The expression "spaced apart" preferably expresses that the two elements referred to are not in direct physical contact one with the other. Preferably, the fact that these elements are spaced apart results in the elements being electrically separated.

In some embodiments, the present invention aims at reducing or even avoiding the use of laser scribing process for interconnection of thin-film unit devices such as thin-film solar cells within larger modules, such as solar modules. As a result, the present invention may reduce and even completely remove the necessity of employment of laser etching machines and precise alignment tools, potentially resulting in lower manufacturing costs of solar modules, for example. The disclosed invention may be applied to the various devices, preferably thin-film devices, such as solar cell technologies comprising silicon-based thin film solar cells, compound-based thin-film solar cells, organic-based solar cells, dye sensitized solar cells, and perovskite solar cells.

In an embodiment, lacks one, two or any scribing/and/or patterning steps. In an embodiment, the method of the invention lacks one or both of the following scribing and/or patterning steps:
(i) patterning and/or scribing a lower conductive layer 201, 201, and,
(ii) patterning and/or scribing an electronic layer 203, 204.

Preferably, in accordance with this embodiment, physically separate lower conductive layers 201, 201 of adjacent unit devices 11, 12 are obtained by controlling a direction of deposition of said lower conductive layer with respect to said intermediate structure 301, 401, 501.

Preferably, in accordance with this embodiment, adjacent but physically separate electronic layers 203, 204 of adjacent unit devices 11, 12 are obtained by controlling a direction of deposition of said electronic layers with respect to said intermediate structure 301, 401, 501.

In a preferred embodiment, the method of the invention lacks any scribing and/or patterning of one or more layers constituting or contributing to the electronic layer 203, 204.

In a preferred embodiment, the method of the invention lacks in particular any scribing and/or patterning of one or more layers constituting or contributing to the upper conducting layer 205, 206. This step is particular delicate and requires particular precise working and implies the risk of damages, for example to the underlying conducting layer. Said scribing and/or patterning, which is absent, preferably refers to laser scribing.

As was described in the background of the invention, the main purpose of the layers patterning by means of laser scribing is to provide P1, P2 and P3 scribing lines in order to establish interconnection between unit devices within the overall module. In this specification, intermediate structures are disclosed, which are formed on the substrate and which may assist in the self-patterning of layers during the deposition process due to the shadowing effect that leads to a discontinuity of the deposited layers.

The said intermediate structures preferably refers to any structure which stands up above the substrate, regardless the shape or profile of the structure. Depending on the embodiment, these intermediate structures may be composed of insulating, conducting, or semiconducting material. For example, in some embodiments where these intermediate structures should be insulating, they may be formed from the photoresist polymer upon the photolithography process. In other embodiments where intermediate structures should be conducting, these structures may be formed using an electroplating process.

The main purpose of using intermediate structures is to effectively pattern a particular layer of the unit cells while performing a deposition of this particular layer. This is carried out by employing the shadowing effect. During the layer deposition, a intermediate structure functions as an obstacle for the material flow, obscuring some areas of the surface at or near the intermediate structure. These areas are effectively in the shadow of the intermediate structure during the deposition process. Therefore, intermediate structures are preventing material from being deposited in these shadowed areas. As a result, instead of a continuous film, the deposited layer appears fractured by gaps in the shadow areas related to the intermediate structure.

The said shadowed areas may depend on the profile of the employed intermediate structure. Therefore, different embodiments may employ intermediate structures with different profiles, revealing different sizes of gaps in deposited layers. Also said shadowed areas may depend on the direction of the material deposition, therefore some embodiments may employ oblique deposition with skew direction of material deposition.

In application to the deposition of layers which are subjected to self-patterning, material deposition techniques should preferably deliver directional flow of deposited materials. Therefore various physical vapour deposition techniques are preferred for deposition of the electrode layer. However some degree of isotropicity may be tolerated due to the profile of employed intermediate structures. For instance, a negative-tapered (undercut) profile of the structures reveals a large shadow area that is obscured for material deposition. Also, in case of solution-based deposition, a meniscus may cause similar self-patterning in the proximity of intermediate structures. Therefore, more deposition techniques can be applied including spray coating, printing, casting deposition and others. In some embodiments, the said negative-tapered structure may be fabricated employing photolithography with underexposure of a positive photoresist, or with overexposure of a negative photoresist.

Compared to a patterning process performed by laser scribing, where precise positioning tools are required to adjust relative position of the unit device and of the laser beam, self-patterning achieved by employment of the intermediate structures does not require precise positioning tools. This is because the fracturing of the deposited layer happens along the intermediate structures, and therefore realized layer gaps are self-aligned in the respect to these intermediate structures. Employing self-aligned patterning, the blind area between P1 and P3 gaps may be reduced compared to the laser scribing process. Therefore this method potentially allows improvement of efficiency in case of a solar cell, for example, since the said blind area is not generating photovoltaic energy.

In some embodiments, the device comprises a plurality if substantially straight lines, which are preferably extending in parallel. Depending on the embodiment, the said intermediate structures are not necessarily straight and/or parallel to each other. The intermediate structures may also have variable profiles that may be different in various parts of the device module. For example, in some embodiments, employed conducting intermediate structures may be also used to form pads or other structures on the edges of the module for ability to electrically connect different modules between each other. This way smaller modules may be assembled into a bigger one, which may further simplify production of the modules.

Depending on the embodiment, using the said intermediate structures, modules may be fabricated on substrates of an abstract shape, which may include but not limited to the rectangular, triangular polygonal and round shapes of the substrate. Also the fabricated module may be integrated with various functional coatings. For example, the said functional coating may be an antireflective coating, water barrier coating, self-cleaning coating, encapsulation coating for stability improvement or other coatings. Such additional functional coatings are not shown in the figures.

While certain of the preferred embodiments of the present invention have been described and specifically exemplified above, it is not intended that the invention be limited to such embodiments. Various modifications may be made thereto without departing from the scope and spirit of the present invention, as set forth in the following claims. Herein above, embodiments of the invention are disclosed. These embodiments are for illustration only and are not intended to limit the scope of the present invention.

The invention claimed is:

1. A multilayer electronic device comprising a plurality of unit electronic devices, said unit electronic devices being connected in series, wherein said plurality of unit electronic devices comprise at least first and second neighbouring unit electronic devices, wherein the multilayer electronic device comprises a substrate or non-conducting base layer,
   wherein each of said first and second unit devices comprises a lower conductive layer and an upper conductive layer, wherein each of said first and second unit devices comprise at least one electronic layer comprising a material having semiconducting, photovoltaic, photoelectric and/or electroluminescent properties, said electronic layer being provided between said upper and lower conductive layer of the corresponding first and second unit devices,
   wherein the multilayer electronic device comprises an intermediate structure formed by a single, continuous and homogenous material which has continuous electronic properties and provided between said first and second unit electronic devices, wherein:
      a bottom of said intermediate structure is in direct contact with the lower conductive layer of said second unit electronic device,
      said intermediate structure physically separates at least part of the electronic layers of said first and second unit electronic devices, and
      said intermediate structure comprises a conductive material and is provided to electrically connect the upper conductive layer of said first unit electronic device with the lower conductive layer of the said second unit electronic device,
   wherein the lower conductive layers of said first and second unit devices are separated by a gap, and wherein said intermediate structure is tilted, tapered and/or curved towards a side that is opposite to and away from said gap such that said intermediate structure slopes upward and away from said gap and from the lower conductive layer of said first unit electronic device.

2. The electronic device of claim 1, wherein said intermediate structure is in contact with both, said substrate and said lower conductive layer.

3. The electronic device of claim 1, wherein said intermediate structure, when seen in transverse section, is asymmetric.

4. The electronic device of claim 1, wherein said intermediate structure is an aid for the deposition of layers said aid being provided for allowing the non-continuous deposition of a layer deposited subsequently to the deposition of said intermediate structure.

5. The electronic device of claim 1, wherein said intermediate structure comprises one or more characteristics selected from the group consisting of:
   (i) the intermediate structure comprises a material that is different from the material forming said substrate,
   (ii) said intermediate structure is a structure that is distinct from said substrate, and,
   (iii) said intermediate structure comprises a deposited material.

6. The electronic device of claim 1, wherein the intermediate structure is partially or totally provided on the substrate, wherein:
the lower conductive layer of said first electronic unit device is spaced apart from said intermediate structure, and/or,
the upper conductive layer of the second electronic unit device is spaced apart from said intermediate structure.

7. The electronic device of claim 1, wherein the intermediate structure, when seen in transverse section, comprises a lateral side at least part of which is oblique and/or curved with respect to the surface of the substrate such that at least part of the lateral side provides an overhang projection on said substrate or on said lower conductive layer.

8. The electronic device of claim 1, which lacks a passivation or other separating layer between the intermediate structure and the lower conductive layer or, if the intermediate structure is deposited on the substrate, between the intermediate structure and said substrate.

9. The electronic device of claim 1, wherein said substrate provides a flat, planar, even and/or unstructured surface on which the lower conductive layer and further components, as appropriate, of are provided, and/or wherein said substrate is flat, planar, even and/or unstructured between neighbouring unit electronic devices.

10. The electronic device of claim 1, which is a thin-film device.

11. A method for producing a multilayer electronic device comprising a plurality of unit electronic devices, said unit electronic devices being connected in series, wherein said plurality of unit electronic devices comprise at least first and second neighboring unit electronic devices, the method comprising:
providing a substrate comprising a first conductive layer forming first conductive layers of said first and second unit devices, wherein said first conductive layers of said first and second unit devices are electrically separated by a gap;
depositing an intermediate structure at least partially on the first conductive layer of said second unit device so as to be in direct contact with said first conductive layer, wherein the intermediate structure comprises a conductive material;
depositing at least one electronic layer comprising a material having semiconducting, photovoltaic, photoelectric and/or electroluminescent properties;
depositing a second conductive layer, wherein during depositing said second conductive layer said intermediate structure provides a shaded area and/or separation structure such that, during depositing said second conductive layer, second conductive layers of said first and second unit devices are obtained, said second conductive layers being electrically separated by said shaded area and/or separation structure,
wherein the intermediate structure is provided to electrically connect the second conductive layer of a first unit electronic device with the first conductive layer of a second unit electronic device,
wherein the intermediate structure is deposited in a single deposition step and is formed by a single, continuous and homogenous material which has continuous electronic properties, and wherein the intermediate structure is deposited so as to be tilted, tapered and/or curved towards a side that is opposite to and away from said gap such that said intermediate structure slopes upward and away from said gap and from the first conductive layer of said first unit electronic device.

12. The method of claim 11, wherein providing said substrate comprising said first conductive layer comprises:
providing a substrate and/or a non-conducting base layer;
depositing said first conductive layer on said substrate and/or non-conducting base layer.

13. The method of claim 11, wherein depositing said second conductive layer comprises adjusting a deposition angle such that said second conductive layer is non-continuously deposited, so as to form a non-continuous layer on said electronic layer and/or on said intermediate structure.

14. The method of claim 11, wherein depositing said second conductive layer comprises adjusting a deposition angle such that the second conductive layer of said first unit electronic device or the second conductive layer of said second unit electronic device is separated from said intermediate structure.

15. The method of claim 11, wherein depositing said first conductive layer is performed before depositing said intermediate structure on said substrate, and wherein said intermediate structure is partially or totally deposited on said first conductive layer.

16. The method of claim 11, wherein said intermediate structure is deposited so as to be separate from the first conductive layer of a first device.

17. The method of claim 11, wherein depositing said intermediate structure comprises depositing at least part of said intermediate structure so as to comprise an oblique or curved profile, when seen in cross-section of said intermediate structure, said oblique or curved profile providing a shading or separation area on said substrate or on said first conductive layer.

18. The method of claim 11, which lacks patterning and/or scribing an electronic layer.

19. The electronic device of claim 10, wherein said thin-film device is selected from the group consisting of thin-film solar cells, thin-film transistors, thin-film LEDs, and thin-film OLEDs.

20. The electronic device of claim 1, wherein said intermediate structure is the only structure which longitudinally extends between neighbouring unit electronic devices and provides a projection on said surface of said substrate or on said lower conductive layer.

21. The electronic device of claim 1, wherein said intermediate structure is at least partially within said gap.

22. The method of claim 11, wherein said intermediate structure is at least partially within said gap.

* * * * *